(12) United States Patent
Brenna

(10) Patent No.: US 8,471,335 B2
(45) Date of Patent: Jun. 25, 2013

(54) SEMICONDUCTOR STRUCTURE WITH ALIGNMENT CONTROL MASK

(75) Inventor: Emanuele Brenna, Lecco (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/164,502

(22) Filed: Jun. 20, 2011

(65) Prior Publication Data

US 2011/0309532 A1    Dec. 22, 2011

(30) Foreign Application Priority Data

Jun. 21, 2010 (IT) .............................. TO2010A0530

(51) Int. Cl.
*H01L 27/00* (2006.01)

(52) U.S. Cl.
USPC .......................................... 257/336; 257/338

(58) Field of Classification Search
USPC .................................. 257/338, 336
See application file for complete search history.

(56) References Cited

U.S. PATENT DOCUMENTS

| 5,699,282 | A | * | 12/1997 | Allen et al. ..................... 702/85 |
| 5,702,717 | A | * | 12/1997 | Cha et al. ..................... 424/425 |
| 5,712,707 | A | | 1/1998 | Ausschnitt et al. |
| 2005/0089775 | A1 | | 4/2005 | Archie et al. |

* cited by examiner

Primary Examiner — Howard Weiss
Assistant Examiner — Steven Rao
(74) Attorney, Agent, or Firm — Seed IP Law Group PLLC

(57) ABSTRACT

A semiconductor structure includes a semiconductor substrate, formed on which are a first layer and a second layer, and an alignment-control mask. The alignment-control mask includes a first direction reference element, formed in a first region of the first layer and extending in a first alignment direction, and first position reference elements, formed in a first region of the second layer that corresponds to the first region of the first layer accommodating the first direction reference element. The first position reference elements are arranged in succession in the first alignment direction and in respective staggered positions with respect to a second alignment direction perpendicular to the first alignment direction.

25 Claims, 5 Drawing Sheets

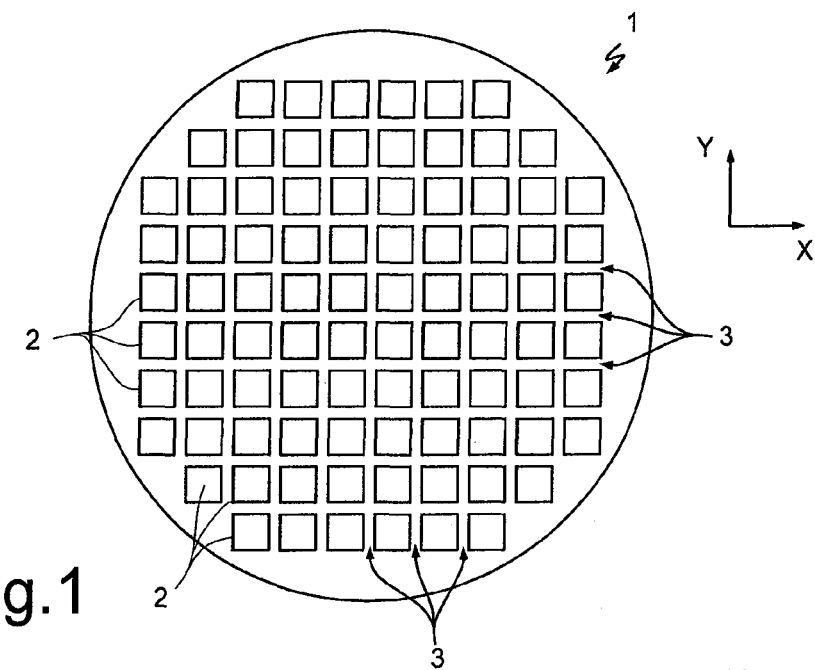
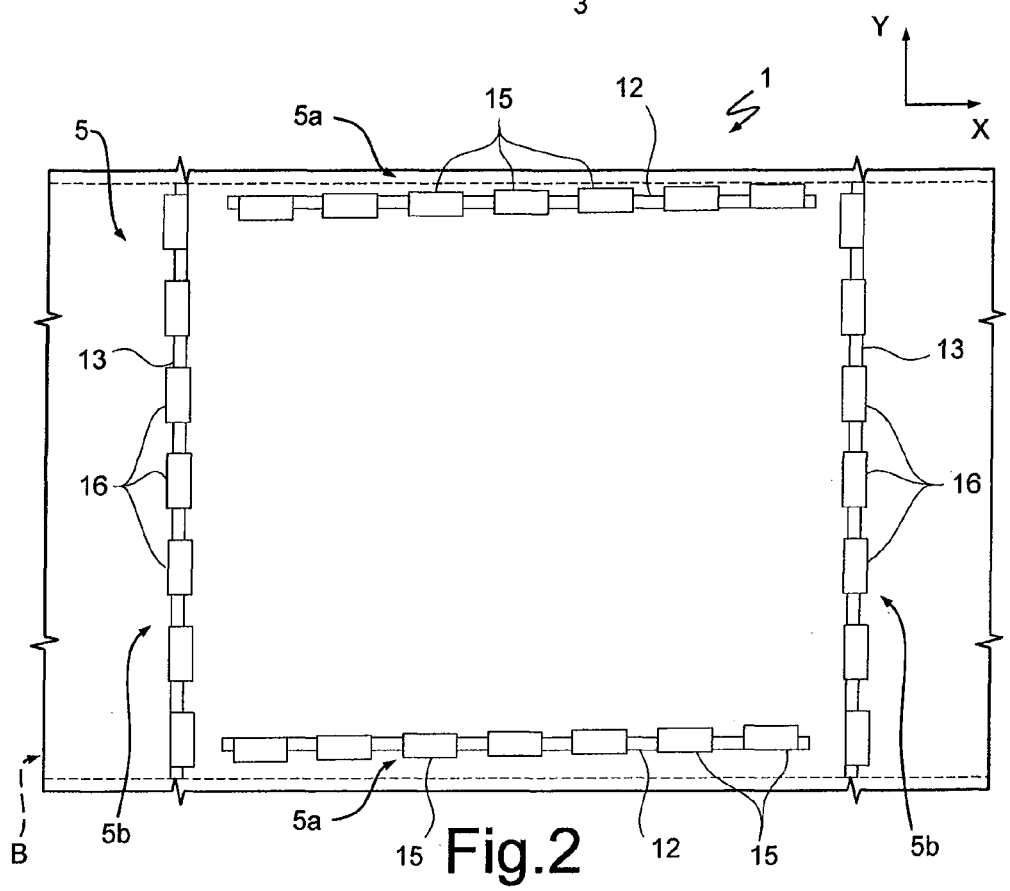

SEMICONDUCTOR STRUCTURE WITH ALIGNMENT CONTROL MASK

BACKGROUND

1. Technical Field

The present disclosure relates to a semiconductor structure with alignment-control mask.

2. Description of the Related Art

As is known, the production of semiconductor devices involves processing of different layers of various materials. The layers are made in succession so as to form a stack on top of the substrate of a semiconductor wafer, and each undergoes a series of treatments before a subsequent layer is formed.

By processes for example of selective etching, photolithography, patterning, implantation, planarization, and so forth, structures or portions of structures are formed in each layer that must be aligned to corresponding elements in underlying layers with given levels of precision and within well-defined tolerances. For example, in a circuit the contact terminals of each device should be properly aligned to the respective connection lines used for communication with the rest of the circuit and are in general made in more superficial layers as compared to the devices.

In order to evaluate the precision of the alignment during and after manufacturing, areas of the wafer that are not to accommodate devices are used to create control grids. Typically, the control grids are formed in the scribe lines provided for dicing the wafer. The grids comprise sets of reference marks arranged on different layers in pre-determined relationships of position.

Examination of the control grids under the optical microscope enables verification of the alignment of structures formed in two or more layers. The grids can be used to evaluate the degree of a misalignment on the basis of the differences detected with respect to expected relative positions of the reference marks belonging to different layers.

A solution commonly adopted is represented by the so-called "Vernier grids or structures", which comprise a plurality of rectilinear marks arranged in two layers in succession along an axis and perpendicular to the axis itself.

To ensure greater reliability, the sets of reference marks are in general redundant. Subsets of reference marks are repeated two or more times at a certain distance so as to have available a number of references. The repetition of the reference marks, among other things, enables a better appreciation of defects of alignment due to relative rotations between the structures of distinct layers. However, known control grids are organized in such a way that rather extensive regions are not usable for accommodating other structures.

Furthermore, it is frequently desired to evaluate simultaneously or in succession the alignment of different pairs of layers. Each pair of layers must hence have a respective set of reference marks, which must not be superimposed on the reference marks for other pairs of layers.

This leads to the area occupied by the control grids being as a whole rather extensive. In particular, conflicts may arise with the desire to maximize the number of devices that can be obtained from a semiconductor wafer.

BRIEF SUMMARY

The aim of the present disclosure is to provide a semiconductor structure provided with an alignment-control mask that is compatible with control of alignment of a number of pairs of layers without substantially increasing the area occupied.

BRIEF DESCRIPTION OF THE SEVERAL VIEWS OF THE DRAWINGS

For a better understanding of the disclosure, some embodiments thereof will now be described purely by way of non-limiting example and with reference to the attached drawings, wherein:

FIG. 1 is a top plan view of a semiconductor wafer according to one embodiment of the present disclosure;

FIG. 2 is a top plan view, with parts removed, of an enlarged detail of the wafer of FIG. 1;

DETAILED DESCRIPTION

Figure 3:
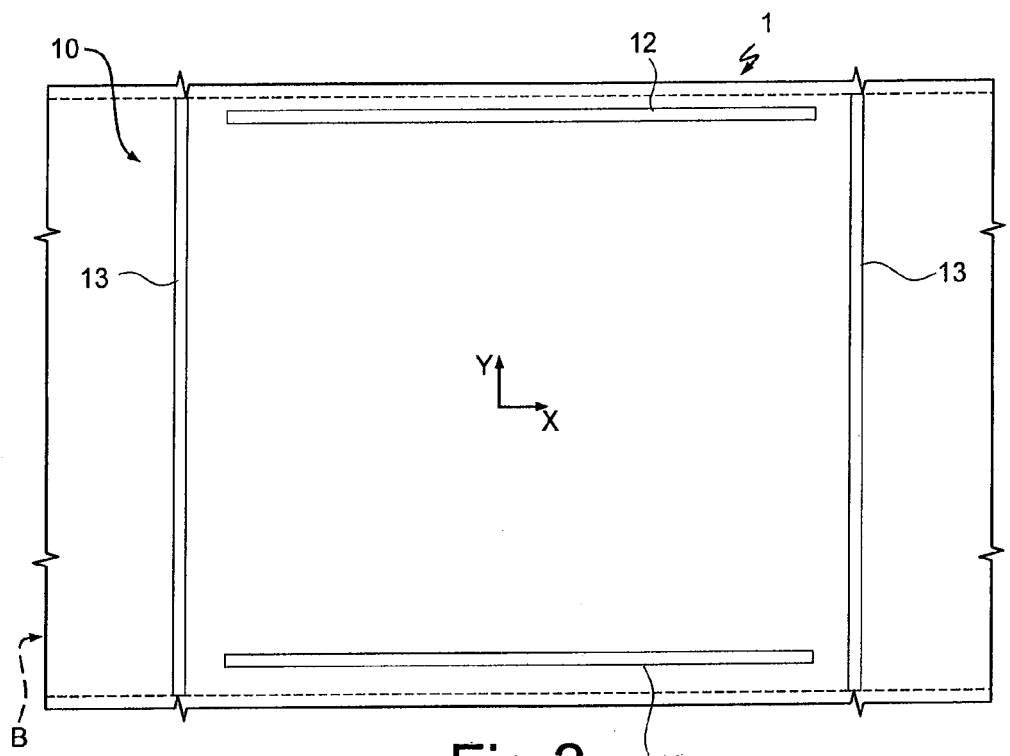
FIG. 3 is a top plan view of a first layer of the wafer of FIG. 1, corresponding to the detail of FIG. 2.

FIG. 1 shows a semiconductor wafer, designated as a whole by the reference number 1, which comprises a plurality of die areas 2, separated from one another by scribe lines 3. The wafer 1 is shown in an intermediate step of a manufacturing process, whereby in each die area 2 an integrated device is obtained, for example an integrated circuit or a microelectromechanical system (MEMS), for simplicity not shown. Here and in what follows, it is understood that the wafer 1 comprises a plurality of layers and structures of semiconductor material, either dielectric or conductive, which are formed on a semiconductor substrate 4, which, for simplicity, is shown only in FIGS. 5 and 6.

The scribe lines 3 are mutually perpendicular and form a grid. Once the integrated devices and possible steps of packaging at the wafer level have been completed, the die areas 2 will be separated using a dicing tool, in general mechanical, which passes along the scribe lines 3.

FIGS. 2-6 illustrate an enlarged detail of one of the scribe lines 3 of the wafer 1, where an alignment-control mask 5 is provided.

Figure 4:
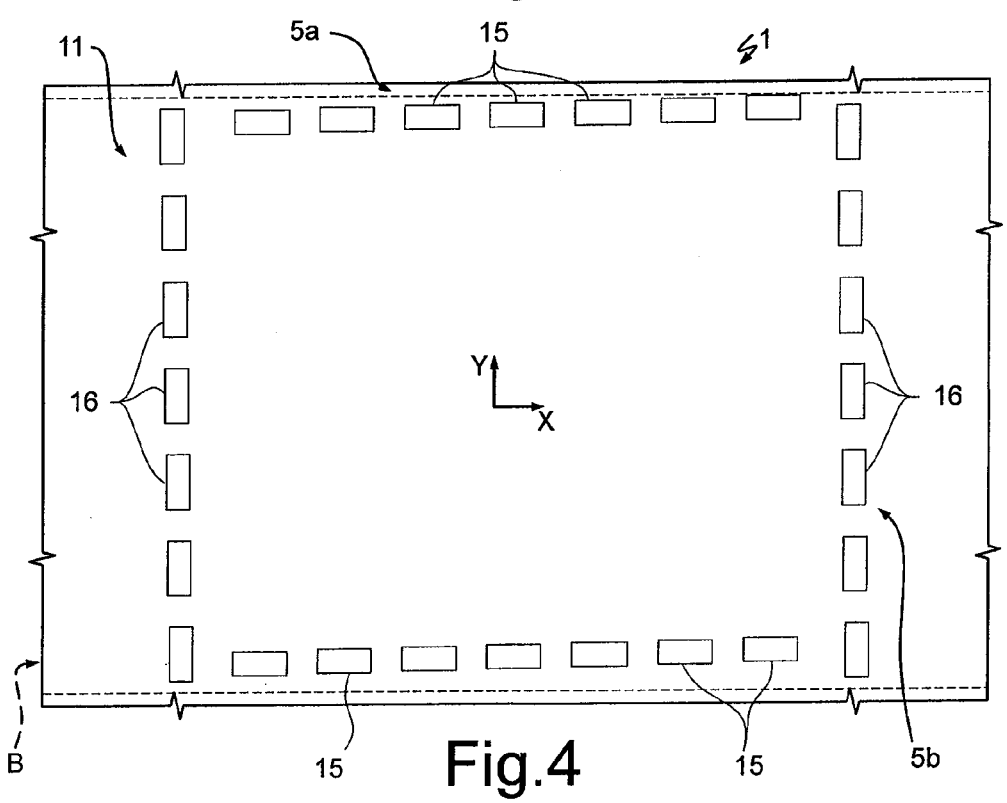
FIG. 4 is a top plan view of a second layer of the wafer of FIG. 1, corresponding to the detail of FIG. 2.
Figure 5:
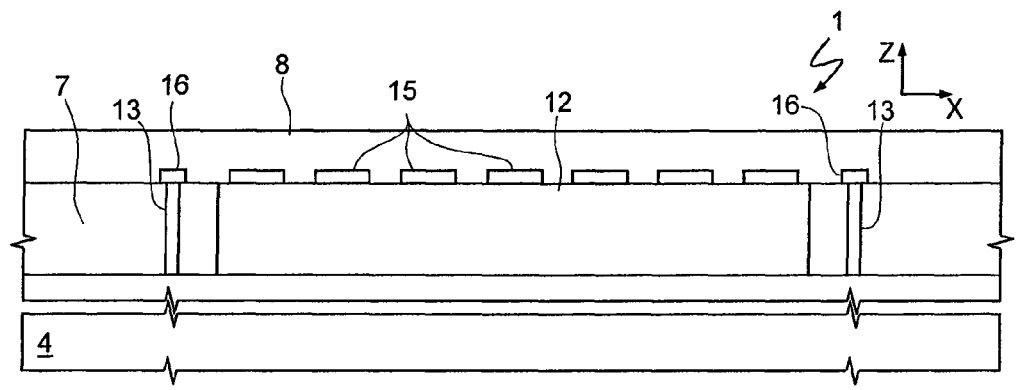
FIG. 5 is a cross section of the wafer of FIG. 1, taken along the line V-V of FIG. 2.
Figure 6:
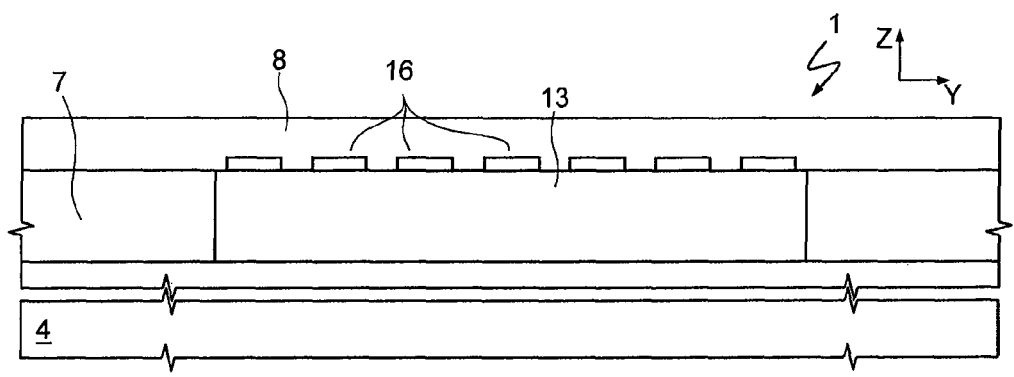
FIG. 6 is a cross section of the wafer of FIG. 1, taken along the line VI-VI of FIG. 2.

As may be seen more clearly in FIGS. 5 and 6, in particular, the wafer 1 comprises a first dielectric layer 7, arranged on the substrate 4, and a second dielectric layer 8, formed on the first dielectric layer 7 (in FIGS. 2-4 the first dielectric layer 7 has been removed for simplicity). The term "substrate" is understood here and in what follows to indicate a layer or a stack of layers that may be made of dielectric materials, semiconductor materials, or metal materials and, in general, of any material that can be used in manufacturing semiconductor devices.

The alignment-control mask 5 is formed in part in the first dielectric layer 7 and in part in the second dielectric layer 8 and comprises a first pattern 10 and a second pattern 11, shown separately in FIG. 3 and in FIG. 4, respectively.

The first pattern 10 is accommodated in the first dielectric layer 7 and comprises first direction reference elements 12 (two in the example) and second direction reference elements 13 (two in the example).

As viewed from a direction Z perpendicular to a surface 1a of the wafer 1 (i.e., in the view of FIGS. 2-4; the direction of observation Z is represented in FIGS. 5 and 6), the first direction reference elements 12 and the second direction reference elements 13 are continuous strips, elongated in shape, and are arranged parallel, respectively, to a first alignment direction X and to a second alignment direction Y, which are mutually perpendicular. In the embodiment described, in particular, the first direction reference elements 12 and the second direction reference elements 13 are arranged so as to delimit substantially a rectangular region. More precisely, the first direction reference elements 12 are arranged in a band B extending in the first alignment direction X and having a width substantially equal to the major dimension of the second direction reference elements 13. The second direction reference elements 13 are arranged symmetrically on opposite sides of the first direction reference elements 12.

In the embodiment described, moreover, the first direction reference elements 12 and the second direction reference elements 13 are made of tungsten, extend throughout the thickness of the first dielectric layer 7 (FIGS. 5 and 6) and have substantially the same shape. For example, a major dimension of the first direction reference elements 12 and of the second direction reference elements 13 is approximately 70 μm, whereas a minor dimension is approximately 5 μm.

The second pattern 11 is formed in the second dielectric layer 8 and comprises a set of first position reference elements 15 for each first direction reference element 12 and a set of second position reference elements 16 for each second direction reference element 13. In the embodiment described, the first position reference elements 15 and the second position reference elements 16 are metal and are made of a layer, for example a copper or aluminium layer, or of a multilayer.

A first direction reference element 12 of the first pattern 10 and the set of first position reference elements 15 associated thereto form a first alignment-control reference module 5a in the second alignment direction Y.

Likewise, a second direction reference element 13 of the second pattern 11 and the set of second position reference elements 16 associated thereto form a second reference module 5b in the first alignment direction X.

In the embodiment described, the first position reference elements 15 and the second position reference elements 16 have the same rectangular shape, with a major dimension of approximately 8 μm and a minor dimension of approximately 5.6 μm.

Preferably, the minor dimension of the first position reference elements 15 and the second position reference elements 16 is greater than the minor dimension of the first direction reference elements 12 and of the second direction reference elements 13.

The first position reference elements 15 and the second position reference elements 16 are arranged in succession along the respective first direction reference elements 12 and second direction reference elements 13 and, in each set, are in staggered positions in a direction perpendicular to the respective first reference elements 12 or second reference elements 13.

In greater detail, the first position reference elements 15 of each first reference module 5a are arranged in succession along the respective first direction reference element 12, parallel to the first alignment direction X, and in one embodiment are set at uniform distances apart (for example of 2 μm). In the second alignment direction Y, the first position reference elements 15 of each first reference module 5a are in respective staggered positions, and the degree of alignment for the respective first direction reference element 12 varies. Hereinafter, for simplicity, the configuration of just one first reference module 5a will be described, it being understood that each of the other first reference modules 5a is configured in an identical way as regards both the relative positions of the first position reference elements 15 with respect to one another and the relative positions of the first position reference elements 15 with respect to the corresponding first direction reference element 12.

In the embodiment described (FIG. 2), the first position reference elements 15 are arranged in such a way that, in the case of correct alignment, a first central position reference element 15 is superimposed symmetrically on the respective first direction reference element 12. The edges of the first central position reference element 15 parallel to the first alignment direction X project symmetrically with respect to the first direction reference element 12 in the second alignment direction Y. The first position reference elements 15 that precede the first central position reference element 15 in the first alignment direction X are staggered in the second alignment direction Y towards one side of the first direction reference element 12. The first position reference elements 15 that follow the first central position reference element 15 in the first alignment direction X are staggered in the second alignment direction Y towards the opposite side of the first direction reference element 12.

The first position reference elements 15 are staggered in the second alignment direction Y to a greater extent the greater their distance from the first central position reference element 15.

The second position reference elements 16 of each second reference module 5b are arranged in succession along the respective second direction reference element 13, parallel to the second alignment direction Y, and in one embodiment are set at uniform distances apart (for example 2 μm). In the first alignment direction X, the second position reference elements 16 of each second reference module 5b are in respective staggered positions, and the degree of alignment for the respective second direction reference element 13 varies. Hereinafter, for simplicity, the configuration of just one second reference module 5b will be described, it being understood that each other second reference module 5b is configured in an identical way as regards both the relative positions of the second position reference elements 16 with respect to one another and the relative positions of the second position reference elements 16 with respect to the corresponding second direction reference element 13.

In the reference embodiment described (FIG. 2), the second position reference elements 16 are arranged in such a way that, in the case of correct alignment, a second central position reference element 16 is superimposed on the respective second direction reference element 13 symmetrically. The edges of the second central position reference element 16 that are parallel to the second alignment direction Y project symmetrically with respect to the second direction reference element 13 in the first alignment direction X. The second position reference elements 16 that precede the second central position reference element 16 in the second alignment direction Y are staggered in the first alignment direction X towards one side of the second direction reference element 13. The second position reference elements 16 that follow the second central position reference element 16 in the second alignment direction Y are staggered in the first alignment direction X towards the opposite side of the second direction reference element 13. The second position reference elements 16 are staggered in the first alignment direction X to a greater extent the greater their distance from the second central position reference element 16.

The reference modules formed by a reference element of the first pattern 10 and by the corresponding elements of the associated second pattern 11 present the advantage of extending prevalently in one of the directions of alignment, whereas in the perpendicular alignment direction the encumbrance is minimal (it is in fact reduced to a few microns). The reference modules described can be easily arranged so as to compact alignment-control masks of several pairs of layers. An example of how it is possible to form particularly compact alignment-control masks will be described further hereinafter, with reference to FIGS. 9-11.

Another important advantage is linked to the better visibility of the reference elements that are formed using a step of planarization by CMP (Chemical Mechanical Polishing), particularly when the reference elements are made of tungsten. As already mentioned, this is the case of the first direction reference elements 12 and of the second direction reference elements 13 in the embodiment described. Albeit having reduced overall dimensions in one of the directions of alignment, in the perpendicular alignment direction the first direction reference elements 12 and the second direction reference elements 13 have an amplitude sufficient to exploit the so-called "dishing effect". For a better understanding of the phenomenon, there now follows a brief description of a process for manufacturing the alignment-control mask 5 with the first direction reference elements 12 and the second direction reference elements 13 made of tungsten.

In semiconductor devices, tungsten is typically used to form vias of vertical interconnections or "plugs", which involve forming seats in a dielectric layer by a selective etch, coating the dielectric layer with deposited tungsten so as to fill the seats, and planarizing by CMP.

Figure 7:
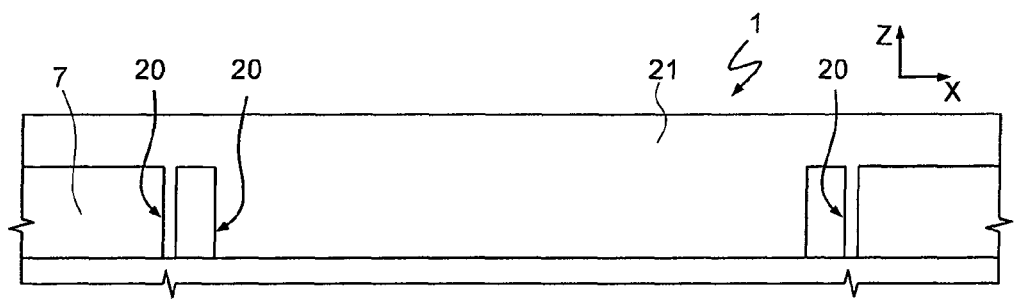
FIGS. 7 and 8 show the view of FIG. 5, in successive steps of a process for manufacturing the wafer of FIG. 1.

During selective etching, in this case of the first dielectric layer 7 (FIG. 7), trenches 20 are opened in the scribe lines 3 having a shape corresponding to the first direction reference elements 12 and to the second direction reference elements 13.

Figure 8:
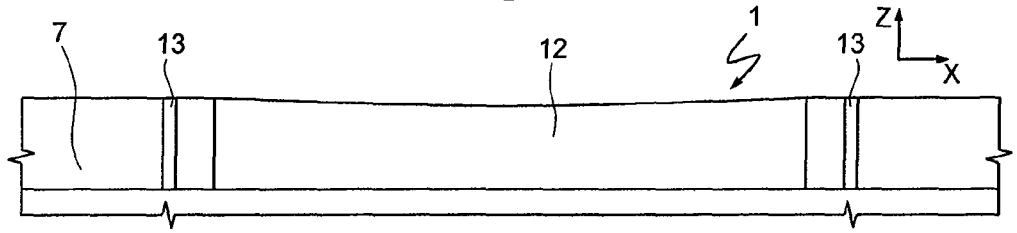

The trenches 20 are then filled by depositing a layer of tungsten 21, as shown in FIG. 8, and a planarization is carried out by a CMP process (FIG. 8).

Finally, a metal layer (or a multilayer) is deposited and shaped to form the first position reference elements 15 and the second position reference elements 16, together with metallization lines (not shown) in the die regions 2, and the second dielectric layer 8 is formed. The mask illustrated in FIGS. 2-5 is thus obtained.

The conformation of the tools used to provide the mechanical action during the CMP process causes, on extensive metal regions, a depression, due substantially to the discontinuities between materials at the edges, as shown in an exaggerated way in FIG. 8 (in the other figures, the surface of the tungsten masks is represented for convenience as if they were planar).

The depression forms, however, only if the metal portion is sufficiently extensive, as in the case of the major dimensions of the first direction reference elements 12 and of the second direction reference elements 13 (in general linear dimensions of some tens of microns).

Whereas the dishing effect is to be prevented most times, in the case of the alignment-control masks the non-perfect planarity of the tungsten elements is advantageous. On account of the depression, the thickness of the layer overlying the tungsten masks (in the embodiment described the second dielectric layer 8) is not uniform, but varies between a minimum at the edges up to a maximum where the depression is deeper.

The variation in thickness modifies the optical properties of the top layer, which presents different colouring according to the depth of the depression. In this way, it is possible to clearly distinguish reference elements that occupy a rather small area, as precisely the first direction reference elements 12 and the second direction reference elements 13. Masks with the dimensions of the first position reference elements 15 and second position reference elements 16 would, instead, be too small to cause dishing and would not be practically recognizable. In this connection, it is to be noted that, precisely to overcome the difficulties in recognizing small tungsten masks, frequently the portions of the tungsten alignment-control masks are obtained "in negative form". In practice, extensive internal regions of tungsten are formed on the entire surface of the alignment-control mask, except for small areas that define the reference elements. The reference elements are hence made of other material (for example, a dielectric, such as silicon oxide) and surrounded by tungsten. In this way, the tungsten region is sufficiently extensive to cause dishing and is hence clearly visible. Serious problems can, however, arise at the moment of dicing of the wafer on account of the resistance to cutting of tungsten. In fact, the passage of the dicing tools causes marked mechanical stresses that can lead to lifting of layers, microcracks, and other imperfections, irreparably damaging the devices.

Figure 9:
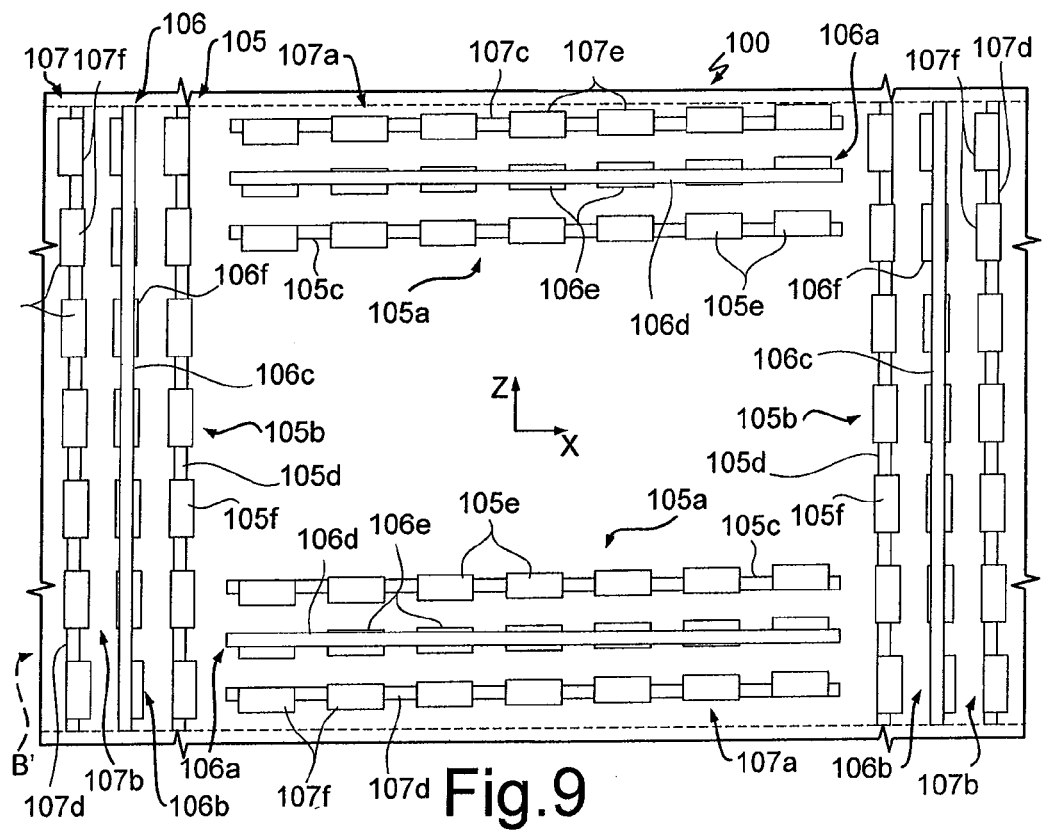
FIG. 9 is a top plan view of a detail of a semiconductor wafer according to a different embodiment of the present disclosure.
Figure 10:
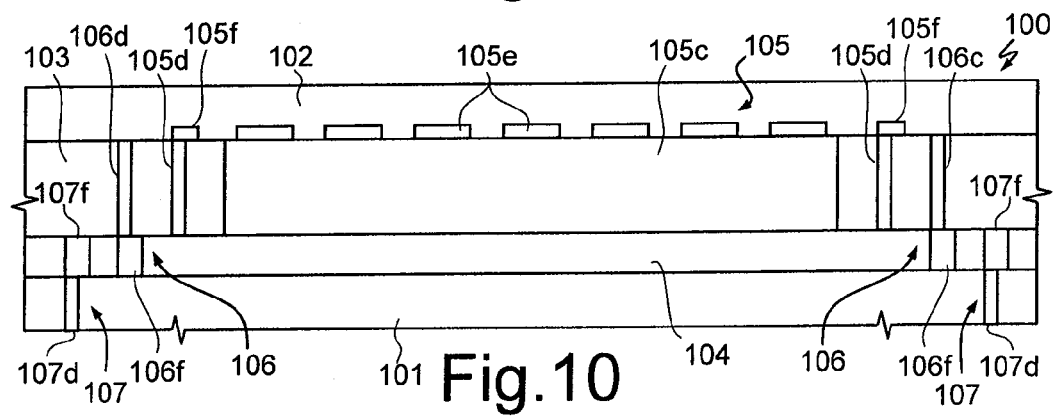
FIG. 10 is a cross section of the wafer of FIG. 9, taken along the line X-X of FIG. 9.
Figure 11:
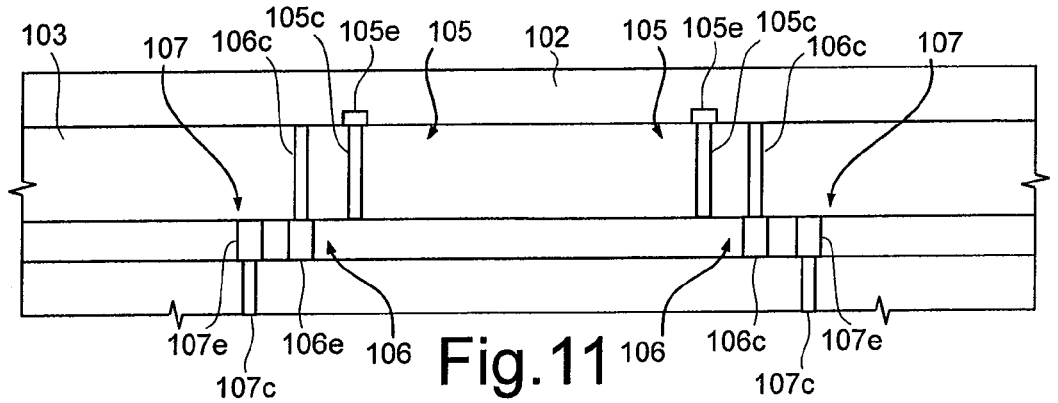
FIG. 11 is a cross section of the wafer of FIG. 9, taken along the line XI-XI of FIG. 1.

FIGS. 9-11 show a different embodiment, whereby a wafer 100 comprises die areas and scribe lines (not shown). The wafer 100 further comprises a substrate 101, on which stacked structural layers 102, 103, 104 are provided.

Alignment-control masks 105, 106, 107 are formed in pairs of adjacent structural layers and comprise respective first direction reference elements 105c, 106c, 107c, second direction reference elements 105d, 106d, 107d, first position reference elements 105e, 106e, 107e, and second position reference elements 105f, 106f, 107f, organized so that the first direction reference elements 105c, 106c, 107c and the first position reference elements 105e, 106e, 107e form first reference modules 105a, 106a, 107a, whereas the second direction reference elements 105d, 106d, 107d and the second position reference elements 105f, 106f, 107f form second reference modules 105b, 106b, 107b of the type already described with reference to FIGS. 2-6. In particular, each first reference module 105a, 106a, 107a comprises a respective first direction reference element 105c, 106c, 107c in the form of a continuous strip parallel to the first alignment direction X, and a set of first position reference elements 105e, 106e, 107e, arranged in succession in the first alignment direction X on top of the respective first direction reference element 105c, 106c, 107c and in staggered positions with respect to the second alignment direction Y. Likewise, each second reference module 105b, 106b, 107b comprises a respective second direction reference element 105d, 106d, 107d, in the form of a continuous strip parallel to the second alignment direction Y, and a set of second position reference elements 105f, 106f, 107f, arranged in succession in the second alignment direction Y on top of the respective second direction reference element 105d, 106d, 107d and in staggered positions with respect to the first alignment direction X.

The alignment mask 105 is formed in part in the structural layer 102 and in part in the structural layer 103, both made of semiconductor material. The first direction reference elements 105c and the second direction reference elements 105d are housed in the structural layer 103 and, in the embodiment described, are made of tungsten, whereas the first position reference elements 105e and the second position reference elements 105f are housed in the structural layer 102 and are, for example, made of aluminium or copper.

The alignment mask 106 is made in part in the structural layer 103 and in part in the structural layer 104, which is also made of semiconductor material. The first direction reference elements 106c and the second direction reference elements 106d, which are made of tungsten, are housed in the structural layer 103, whereas the first position reference elements 106e and the second position reference elements 106f are housed in the structural layer 104 and are, for example, made of polysilicon. The first direction reference elements 106c and the second direction reference elements 106d of the alignment-control mask 106 are consequently located in the layer overlying the corresponding first position reference elements 106e and second position reference elements 106f.

The alignment-control mask 107 is made in part in the structural layer 104 and in part in the substrate 101, which are both made of semiconductor material. The first direction reference elements 107c and the second direction reference elements 107d, which are made of polysilicon, are housed in the structural layer 104, whereas the first position reference elements 107e and the second position reference elements 107f are housed in the substrate 101 and are, for example, made of dielectric material.

The first direction reference elements 105c, 106c, 107c are arranged set alongside in a band B' extending in the first alignment direction X and having a width substantially equal to the lengths of the second direction reference elements 105d, 106d, 107d. The second direction reference elements 105d, 106d, 107d are arranged symmetrically on opposite sides of the first direction reference elements 105c, 106c, 107c and are set alongside one another.

The arrangement described is particularly compact and enables formation in a contained space of alignment-control masks for several pairs of layers.

Figure 12:
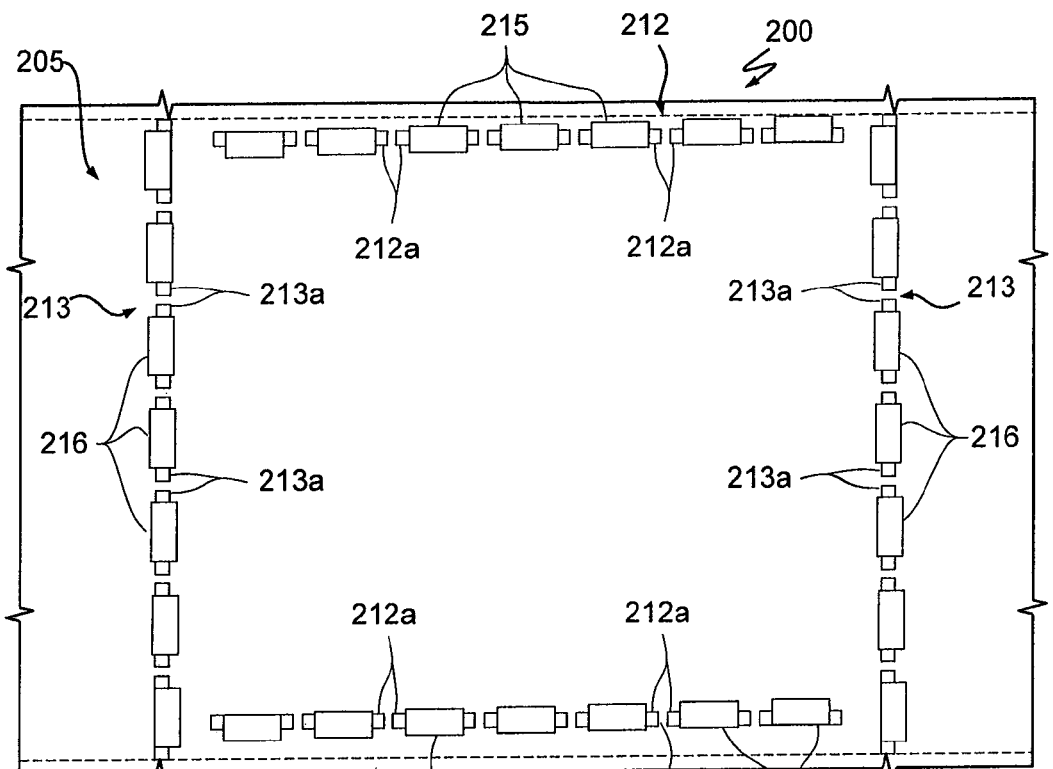
FIG. 12 is a top plan view of a detail of a semiconductor wafer according to a further embodiment of the present disclosure.
Figure 13:
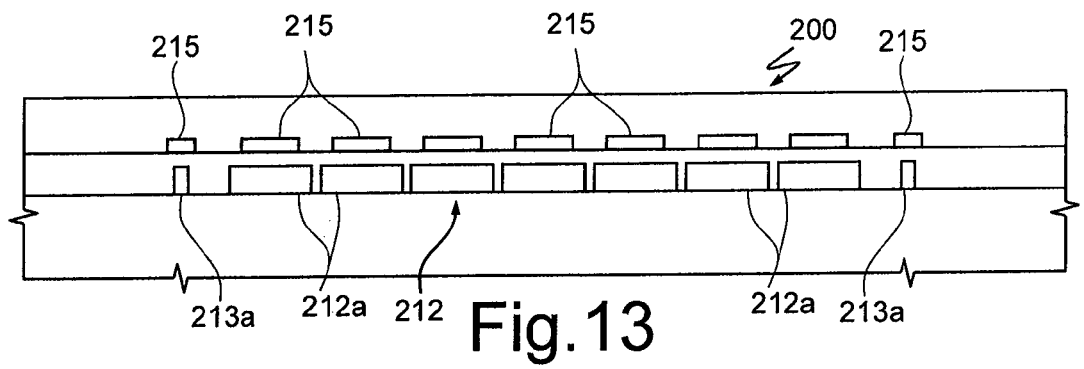
FIG. 13 is a cross section of the wafer of FIG. 12, taken along the line XIII-XIII of FIG. 12.
Figure 14:
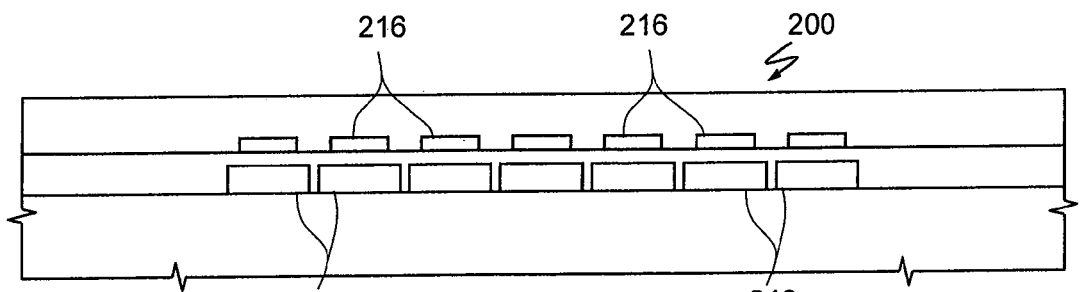
FIG. 14 is a cross section of the wafer of FIG. 12, taken along the line XIV-XIV of FIG. 12.

According to a further embodiment, illustrated in FIGS. 12-14, a wafer 200 comprises die areas and scribe lines (not shown), in which alignment-control masks 205 are made, substantially as described in FIGS. 2-6. In this case, however, first direction reference elements 212 and second direction reference elements 213 are discontinuous and are defined by a plurality, respectively, of first portions 212a, arranged in succession in the first alignment direction X underneath corresponding first position reference elements 215, and of second portions 212b, arranged in succession in the second alignment direction Y underneath corresponding second position reference elements 216.

The embodiment described may be used in particular when the formation of the layers involved does not require planarization with a CMP process (for example, when the reference elements are made of semiconductor or dielectric material).

Finally, it is evident that modifications and variations may be made to the device and to the process described herein, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor structure comprising:
a substrate of a semiconductor material;
a first layer and a second layer formed on the substrate; and
a first alignment control mask, the first alignment control mask including:
   a first direction reference element formed in a first region of the first layer and extending longitudinally in a first alignment direction;
   first position reference elements formed in a first region of the second layer corresponding to the first region of the first layer, wherein the first position reference elements are arranged in succession in the first alignment direction and in respective staggered positions with respect to a second alignment direction transverse to the first alignment direction
   a second direction reference element formed in a second region of the first layer and extending longitudinally in the second alignment direction; and
   second position reference elements formed in a second region of the second layer corresponding to the second region of the first layer, wherein the second position reference elements are arranged in succession in the second alignment direction and in respective staggered positions with respect to the first alignment direction.

2. A structure according to claim 1, wherein the first direction reference element and the second direction reference element are continuous strips.

3. A structure according to claim 2, wherein the first direction reference element and the second direction reference element are made of tungsten.

4. A structure according to claim 1, wherein the first direction reference element includes a plurality of first portions arranged in succession in the first alignment direction under the first position reference elements, respectively, and the second direction reference element includes a plurality of second portions arranged in succession in the second alignment direction under the second position reference elements, respectively.

5. A structure according to claim 1, comprising a third direction reference element in parallel with the first direction reference element and a fourth direction reference element in parallel with the second direction reference element, wherein the first and third direction reference elements are arranged within a band extending in the first alignment direction and having a width substantially equal to a length of the second direction reference element and the second and fourth direction reference elements are symmetrically arranged at opposite sides of the first and third direction reference elements.

6. A structure according to claim 1, comprising:
a third layer above the substrate; and
a second alignment control mask, wherein the second alignment control mask comprises:
   a third direction reference element formed in a third region of the second layer and extending longitudinally in the first alignment direction;

a fourth direction reference element formed in a fourth region of the second layer and extending longitudinally in the second alignment direction;

third position reference elements formed in a first region of the third layer corresponding to the third region of the second layer, wherein the third position reference elements are arranged in succession in the first alignment direction and in respective staggered positions with respect to the second alignment direction; and fourth position reference elements formed in a second region of the third layer corresponding to the fourth region of the second layer, wherein the fourth position reference elements are arranged in succession in the second alignment direction and in respective staggered positions with respect to the first alignment direction.

7. A structure according to claim 1, comprising a second alignment control mask that includes:

a third direction reference element formed in a third region of the second layer and extending longitudinally in the first alignment direction;

a fourth direction reference element formed in a fourth region of the second layer and extending longitudinally in the second alignment direction;

third position reference elements formed in a first region of the substrate corresponding to the third region of the second layer, wherein the third position reference elements are arranged in succession in the first alignment direction and in respective staggered positions with respect to the second alignment direction; and fourth position reference elements formed in a second region of the substrate corresponding to the fourth region of the second layer, wherein the fourth position reference elements are arranged in succession in the second alignment direction and in respective staggered positions with respect to the first alignment direction.

8. A structure according to claim 7, comprising a fifth direction reference element in parallel with the first direction reference element and a sixth direction reference element in parallel with the second direction reference element, wherein the first, third, and fifth direction reference elements are arranged adjacent to one another inside a band extending in the first alignment direction and having a width substantially equal to a length of the second direction reference element; and the second, fourth, and sixth direction reference elements are symmetrically arranged at opposite sides of the first, third, and fifth direction reference elements.

9. A structure according to claim 1, wherein the second layer is formed above the first layer.

10. A structure according to claim 1, comprising die areas and scribing lines, wherein the first and second direction reference elements and the second position reference elements are all arranged in a first scribing line of the scribing lines.

11. A method of manufacturing a semiconductor structure comprising:

forming first layer and second layers on a semiconductor substrate; and forming a first alignment control mask, forming the alignment control mask including:

forming a first direction reference element in a first region of the first layer and extending longitudinally in a first alignment direction;

forming first position reference elements in a first region of the second layer corresponding to the first region of the first layer, wherein the first position reference elements are arranged in succession in the first alignment direction and in respective staggered positions with respect to a second alignment direction transverse to the first alignment direction forming a second direction reference element in a second region of the first layer and extending longitudinally in the second alignment direction; and forming second position reference elements in a second region of the second layer corresponding to the second region of the first layer, wherein the second position reference elements are arranged in succession in the second alignment direction and in respective staggered positions with respect to the first alignment direction.

12. A method according to claim 11, wherein the first direction reference element and the second direction reference element are formed as continuous strips.

13. A method according to claim 11, wherein forming the first direction reference element includes forming a plurality of first portions arranged in succession in the first alignment direction under the first position reference elements, respectively, and forming the second direction reference element includes forming a plurality of second portions arranged in succession in the second alignment direction under the second position reference elements, respectively.

14. A method according to claim 11, comprising forming a third direction reference element in parallel with the first direction reference element and forming a fourth direction reference element in parallel with the second direction reference element, wherein the first and third direction reference elements are arranged within a band extending in the first alignment direction and having a width substantially equal to a length of the second direction reference element and the second and fourth direction reference elements are symmetrically arranged at opposite sides of the first and third direction reference elements.

15. A method according to claim 11, comprising:

forming a third layer above the substrate; and forming a second alignment control mask, wherein forming the second alignment control mask comprises:

forming a third direction reference element in a third region of the second layer and extending longitudinally in the first alignment direction;

forming a fourth direction reference element in a fourth region of the second layer and extending longitudinally in the second alignment direction;

forming third position reference elements in a first region of the third layer corresponding to the third region of the second layer, wherein the third position reference elements are arranged in succession in the first alignment direction and in respective staggered positions with respect to the second alignment direction; and forming fourth position reference elements in a second region of the third layer corresponding to the fourth region of the second layer, wherein the fourth position reference elements are arranged in succession in the second alignment direction and in respective staggered positions with respect to the first alignment direction.

16. A method according to claim 11, comprising forming a second alignment control mask that includes:

forming a third direction reference element in a third region of the second layer and extending longitudinally in the first alignment direction;

forming a fourth direction reference element in a fourth region of the second layer and extending longitudinally in the second alignment direction;

forming third position reference elements in a first region of the substrate corresponding to the third region of the second layer, wherein the third position reference elements are arranged in succession in the first alignment direction and in respective staggered positions with respect to the second alignment direction; and forming fourth position reference elements in a second region of the substrate corresponding to the fourth region of the second layer, wherein the fourth position reference elements are arranged in succession in the second alignment direction and in respective staggered positions with respect to the first alignment direction.

17. A method according to claim 16, comprising forming a fifth direction reference element in parallel with the first direction reference element and forming a sixth direction reference element in parallel with the second direction reference element, wherein the first, third, and fifth direction reference elements are arranged adjacent to one another inside a band extending in the first alignment direction and having a width substantially equal to a length of the second direction reference element; and the second, fourth, and sixth direction reference elements are symmetrically arranged at opposite sides of the first, third, and fifth direction reference elements.

18. A method according to claim 11, wherein the second layer is formed above the first layer.

19. A method according to claim 11, comprising forming die areas and scribing lines on the semiconductor substrate, and arranging the alignment control mask in one of the scribing lines.

20. A semiconductor structure comprising:
a substrate of a semiconductor material;
first, second, and third layers positioned on one another and on the substrate;
a first alignment control mask, the first alignment control mask including:
  a first direction reference element formed in a first region of the first layer and extending longitudinally in a first alignment direction;
  first position reference elements formed in a first region of the second layer corresponding to the first region of the first layer, wherein the first position reference elements are arranged in succession in the first alignment direction and in respective staggered positions with respect to a second alignment direction transverse to the first alignment direction; and
a second alignment control mask that includes:
  a second direction reference element formed in a second region of the second layer and extending longitudinally in the first alignment direction; and
  second position reference elements formed in a first region of the third layer corresponding to the second region of the second layer, wherein the third position reference elements are arranged in succession in the first alignment direction and in respective staggered positions with respect to the second alignment direction.

21. A structure according to claim 20, wherein the first alignment control mask comprises:

a third direction reference element formed in a second region of the first layer and extending longitudinally in the second alignment direction; and
third position reference elements formed in a third region of the second layer corresponding to the second region of the first layer, wherein the third position reference elements are arranged in succession in the second alignment direction and in respective staggered positions with respect to the first alignment direction.

22. A structure according to claim 20, wherein the first direction reference element and the second direction reference element are continuous strips.

23. A semiconductor structure comprising:
a substrate of a semiconductor material;
first, second, and third layers positioned on one another and on the substrate;
a first alignment control mask, the first alignment control mask including:
  a first direction reference element formed in a first region of the first layer and extending longitudinally in a first alignment direction;
  first position reference elements formed in a first region of the second layer corresponding to the first region of the first layer, wherein the first position reference elements are arranged in succession in the first alignment direction and in respective staggered positions with respect to a second alignment direction transverse to the first alignment direction; and
a second alignment control mask that includes:
  a second direction reference element formed in a second region of the second layer and extending longitudinally in the second alignment direction; and
  second position reference elements formed in a first region of the third layer corresponding to the second region of the second layer, wherein the third position reference elements are arranged in succession in the second alignment direction and in respective staggered positions with respect to the first alignment direction.

24. A structure according to claim 23, wherein the first alignment control mask comprises:
a fourth layer under the first, second, and third layers;
a third direction reference element formed in a region of the fourth layer and extending longitudinally in the second alignment direction; and
third position reference elements formed in a second region of the third layer corresponding to the region of the fourth layer, wherein the third position reference elements are arranged in succession in the second alignment direction and in respective staggered positions with respect to the first alignment direction.

25. A structure according to claim 23, wherein the first direction reference element and the second direction reference element are continuous strips.

* * * * *